United States Patent
Takamiya et al.

(10) Patent No.: US 6,522,219 B2
(45) Date of Patent: Feb. 18, 2003

(54) SURFACE ACOUSTIC WAVE LADDER FILTER WITH TWO SERIES RESONATORS HAVING DIFFERENT APODIZATION WEIGHTING

(75) Inventors: Miki Takamiya, Kanazawa (JP); Norio Taniguchi, Ishikawa-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/778,195

(22) Filed: Feb. 7, 2001

(65) Prior Publication Data

US 2001/0011932 A1 Aug. 9, 2001

(30) Foreign Application Priority Data

Feb. 7, 2000 (JP) .......................... 2000-029245
Nov. 17, 2000 (JP) .......................... 2000-351270

(51) Int. Cl.[7] .............................. H03H 9/64; H03H 9/72
(52) U.S. Cl. ................... 333/133; 310/313 C; 333/196; 333/193
(58) Field of Search .................. 333/133, 193–196; 310/313 C, 364

(56) References Cited

U.S. PATENT DOCUMENTS

| | | | | |
|---|---|---|---|---|
| 5,654,680 A | * | 8/1997 | Kwan et al. | 333/195 |
| 5,729,186 A | * | 3/1998 | Seki et al. | 333/194 |
| 5,874,869 A | * | 2/1999 | Ueda et al. | 333/193 |
| 5,909,156 A | * | 6/1999 | Nishihara et al. | 333/193 |
| 6,025,763 A | * | 2/2000 | Morimoto | 333/195 |
| 6,037,847 A | * | 3/2000 | Ueda et al. | 333/193 |
| 6,292,071 B1 | * | 9/2001 | Taniguchi | 333/195 X |

FOREIGN PATENT DOCUMENTS

| | | | |
|---|---|---|---|
| EP | 0 795 958 A2 | * | 9/1997 |
| JP | 56-19765 | | 5/1981 |
| JP | 9-246911 | | 9/1997 |

OTHER PUBLICATIONS

Masafumi Kazmi et al., "Wave–Guiding in SH–Type SAW Resonators on Rotated Y–cut LiTaO$_3$"; *Proceedings of the Acoustic Society of Japan*, Jun., 1979, pp 77–78.

* cited by examiner

*Primary Examiner*—Robert Pascal
*Assistant Examiner*—Barbara Summons
(74) *Attorney, Agent, or Firm*—Keating & Bennett, LLP

(57) ABSTRACT

A surface acoustic wave filter includes a piezoelectric substrate, and at least two series arm resonators and at least one parallel arm resonator each constituted by a one-port surface acoustic wave resonator, disposed on the piezoelectric substrate. The at least two series arm resonators and at least one parallel arm resonator are connected to define a ladder-type circuit. Each of the at least two series arm resonators includes an interdigital transducer weighted by apodization, and the apodizations for the at least two series arm resonators are different from each other.

15 Claims, 14 Drawing Sheets

SURFACE ACOUSTIC WAVE LADDER FILTER WITH TWO SERIES RESONATORS HAVING DIFFERENT APODIZATION WEIGHTING

BACKGROUND OF THE INVENTION

1. Field of the Invention

The present invention relates to surface acoustic wave filters for use as band-pass filters in, for example, mobile communications systems, and more particularly, to a ladder-type surface acoustic wave filter in which a plurality of one-port surface acoustic wave resonators are connected to define a ladder-type circuit.

2. Description of the Related Art

Conventionally, various surface acoustic wave filters have been proposed as band-pass filters. For example, Japanese Patent No. 56-19765 and Japanese Unexamined Patent Application Publication No. 9-246911 disclose surface acoustic wave filters having ladder-type circuit configurations.

FIG. 16 illustrates the basic circuit configuration of a ladder-type surface acoustic wave filter. As shown in FIG. 16, in the surface acoustic wave filter, a signal line extending between an input terminal 101 and an output terminal (not shown) defines a series arm, and at least one series arm resonator 102 is connected to the series arm.

Furthermore, between the series arm and the ground potential, a signal line defining a parallel arm is connected, and a parallel arm resonator 103 is connected to the parallel arm. The series arm resonator 102 and the parallel arm resonator 103 are respectively defined by a one-port surface acoustic wave resonator.

Although FIG. 16 shows a single-stage circuit configuration, however, multiple stages are usually provided in the ladder-type circuit.

The one-port surface acoustic wave resonator typically includes an interdigital transducer (IDT) disposed at a central portion along the direction of surface acoustic wave propagation, and reflectors disposed on both sides of the IDT along the direction of surface acoustic wave propagation.

FIG. 17 is an illustration showing an example of filter characteristics of a surface acoustic wave filter having the conventional ladder-type circuit configuration.

Japanese Patent No. 56-19765 discloses a surface acoustic wave filter having a ladder-type circuit configuration as described above. The surface acoustic wave filter provides a low insertion loss and a wide pass band, and is thus suitably used as a band-pass filter for cellular phones, and other suitable devices.

In the surface acoustic wave filter, the IDT is defined by a pair of comb electrodes arranged such that electrode fingers thereof are interdigitated and such that the overlap lengths of the electrode fingers of the IDT are constant. That is, an IDT in a one-port surface acoustic wave resonator usually is a normal-type IDT.

In a surface acoustic wave resonator having a normal-type IDT, because the overlap lengths of electrode fingers are constant as described above, higher-mode surface acoustic waves, as well as fundamental-mode surface acoustic waves intended to be used, are excited. Generally, the phase velocity of higher-mode surface acoustic waves is larger than the phase velocity of fundamental-mode surface acoustic waves, and therefore, resonance caused by the higher-mode surface acoustic waves appears as sub-resonance on the higher-frequency side as compared with resonance caused by the fundamental-mode surface acoustic waves.

Thus, regarding the filter characteristics of the resonator-based surface acoustic wave filter having the ladder-type circuit configuration, the higher-mode resonance appears as small ripples at the shoulders of the pass band, thereby increasing insertion loss in the pass band.

The normal-type IDT herein refers to an IDT in which all the electrode fingers defining the IDT have equal overlap lengths.

On the other hand, conventionally, an implementation is known in which the overlap lengths (apertures) of the electrode fingers of the IDT defining a surface acoustic wave filter are varied and weighted in accordance with particular principles. The weighting method is called the apodization method. An IDT weighted as such is also called an apodized electrode. The apodization method is conventionally known as a technique for suppressing higher-mode waves.

Japanese Unexamined Patent Application Publication No. 9-246911 discloses a surface acoustic wave filter having a ladder-type circuit configuration including the apodized electrodes which are described as being effective to suppress higher-mode waves. The conventional device has an arrangement in which a surface acoustic wave resonator having an IDT weighted by the apodization method is used as either a parallel arm resonator or a series arm resonator. Also disclosed is an arrangement in which 50% or more of the electrode fingers of the parallel arm resonator are weighted by the apodization method, and in which 30% to 80% of the electrode fingers of the series arm resonator are weighted by the apodization method.

Furthermore, the prior art proposes an arrangement in which either the parallel arm resonator or the series arm resonator is weighted by the apodization method while the other is defined by a SAW resonator having a normal-type IDT.

The conventional art describes that through weighting in accordance with the above particular ratio by the apodization method, occurrence of higher-mode surface acoustic waves, which cause ripples within the pass band of transmission characteristics, is suppressed, and thereby desirable transmission characteristics are obtained.

The method disclosed in Japanese Unexamined Patent Application Publication No. 9-246911 describes that 30% to 80% of the pairs of the electrode fingers of the IDT electrode of the series arm resonator are to be weighted because 30% or less is not sufficiently effective, while 80% or more causes new ripples in the pass band thereby worsening the loss.

As described above, in the surface acoustic wave filter having the conventional ladder-type circuit configuration, disclosed in Japanese Patent No. 56-19765, the higher-mode waves generate ripples at the shoulders of the pass band, narrowing the pass band and worsening the insertion loss.

On the other hand, the surface acoustic wave filter disclosed in Japanese Unexamined Patent Application Publication No. 9-246911 suppresses higher-mode ripples by the above-described weighting. However, although the higher-mode ripples are suppressed, the minimum insertion loss within the pass band remains almost unchanged, or is even smaller.

Band-pass filters to be used in cellular phones, and other suitable devices absolutely require not only small loss within the pass band but also small maximum variation of loss within the pass band. Therefore, an ideal band-pass filter is a filter which provides uniform loss over the entire pass band.

The surface acoustic wave filter disclosed in Japanese Unexamined Patent Application Publication No. 9-246911 suppresses higher-mode ripples as described above, thereby broadening the pass band and providing improved insertion loss characteristics within the pass band. However, the minimum insertion loss remains unchanged or is even smaller. As a result, the variation of loss within the pass band is not reduced.

SUMMARY OF THE INVENTION

To overcome the above-described problems with the prior art, preferred embodiments of the present invention provide a surface acoustic wave filter which eliminates the above-described shortcoming, suppressing ripples caused by higher-mode, broadening the pass band, and reducing the variation of loss within the pass band.

The inventors, through research aimed at eliminating the problems with the prior art, discovered that careful weighting by the apodization method greatly broadens the pass band while minimizing and suppressing ripples caused by higher-mode and also greatly reduces the variation of loss within the pass band, thereby achieving the various advantages of the present invention.

That is, in the arrangement disclosed in Japanese Unexamined Patent Application Publication No. 9-246911, weighting by the apodization method is conducted to maximize suppression of ripples caused by higher-mode waves, which appears on the high-frequency side of the pass band. On the other hand, in accordance with preferred embodiments of the present invention, ripples are intentionally generated within the pass band by the apodization method while optimizing the ripple frequency, and greatly reducing the variation of loss within the pass band.

A surface acoustic wave filter according to at least one preferred embodiment of the present invention includes a piezoelectric substrate and at least two series arm resonators and at least one parallel arm resonator each defined by a one-port surface acoustic wave resonator, disposed on the piezoelectric substrate. The at least two series arm resonators and at least one parallel arm resonator are connected to define a ladder-type circuit. Each of the at least two series arm resonators includes an interdigital transducer weighted by apodization, and the apodizations for the at least two series arm resonators are different from each other.

It is preferable that at least about 80% of electrode fingers of the interdigital transducers of the at least two series arm resonators are apodized.

A ratio between the maximum value and the minimum value of overlapping length in the apodization is preferably different between the at least two series arm resonators. The difference between the two ratios is preferably at least about 0.1, and more preferably at least about 0.2.

Frequency positions of ripples caused by the at least two series arm resonators are preferably different from one another.

The surface acoustic wave filter is preferably used in an antenna duplexer and a communication device.

According to preferred embodiments of the present invention, the frequency positions of the ripples generated by a plurality of serial-arm resonators are varied, such that, with respect to the filter characteristics of the ladder-type surface-acoustic-wave filter, variation of insertion loss within the pass band is greatly reduced which greatly enhances evenness within the pass band.

For the purpose of illustrating the invention, there is shown in the drawings several embodiments which are presently preferred, however, it being understood that the invention is not limited to the precise arrangements and instrumentalities shown.

Other features, elements, characteristics and advantages of the present invention will become more apparent from the detailed description of preferred embodiments below with reference to the attached drawings.

DETAILED DESCRIPTION OF PREFERRED EMBODIMENTS

Hereinafter, preferred embodiments of the present invention are explained in detail with reference to the drawings.

Figure 1:
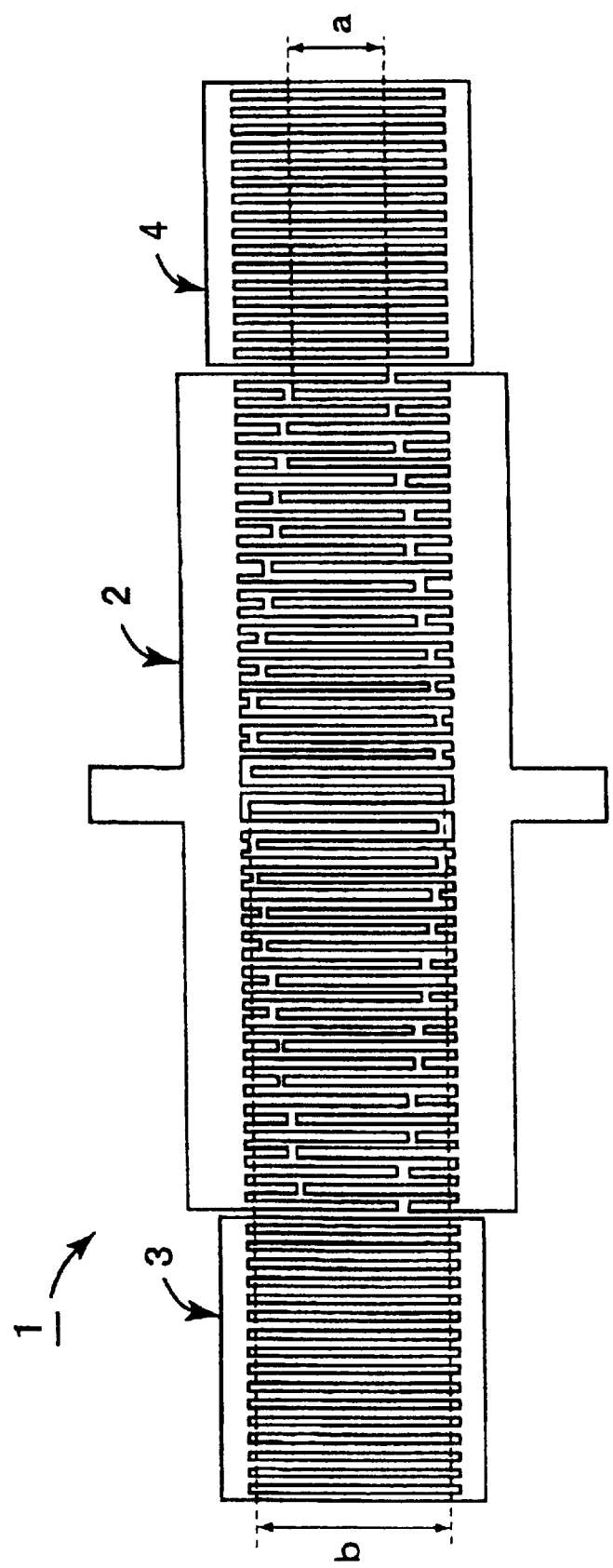
FIG. 1 is a plan view showing the electrode structure of a preferred embodiment of an apodized one-port surface acoustic wave resonator used in a surface acoustic wave filter according to the present invention.

Referring to FIG. 1, the relationship between weighting by the apodization method according to various preferred embodiments of the present invention and ripples generated within the pass band is described. FIG. 1 is a schematic plan view showing the electrode structure of a one-port surface acoustic wave resonator included in a surface acoustic wave filter according to a preferred embodiment of the present invention. The one-port surface acoustic wave resonator 1 shown in FIG. 1 includes an IDT 2 disposed on an approximately central portion along the direction of surface acoustic wave propagation, and grating reflectors 3 and 4 disposed on both sides of the IDT 2 along the direction of surface acoustic wave propagation. The IDT 2 is apodized as shown in the figure. It was determined that, in this case, by varying the ratio x=a/b of the minimum value a of overlap length to the maximum value b of overlap length, ripple frequency could be varied as desired. The ripples herein are equivalent to what is referred to in Japanese Unexamined Patent Application Publication No. 9-246911 as other higher-mode ripples generated near the center of the pass band when at least about 80% of the electrode fingers of the IDT of the series arm resonator are weighted.

Figure 2:
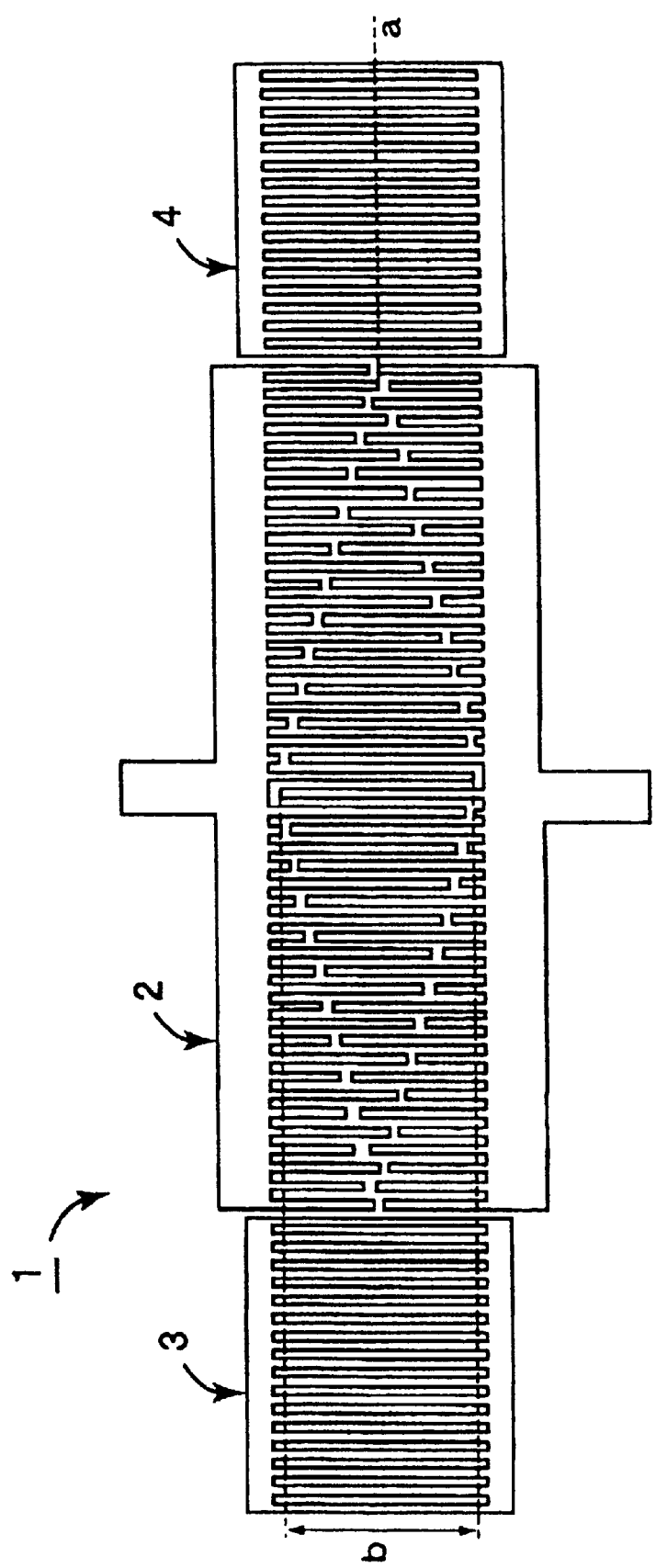
FIG. 2 is a plan view showing the electrode structure of another preferred embodiment of an apodized one-port surface acoustic wave resonator used in a surface acoustic wave filter according to the present invention.
Figure 3:
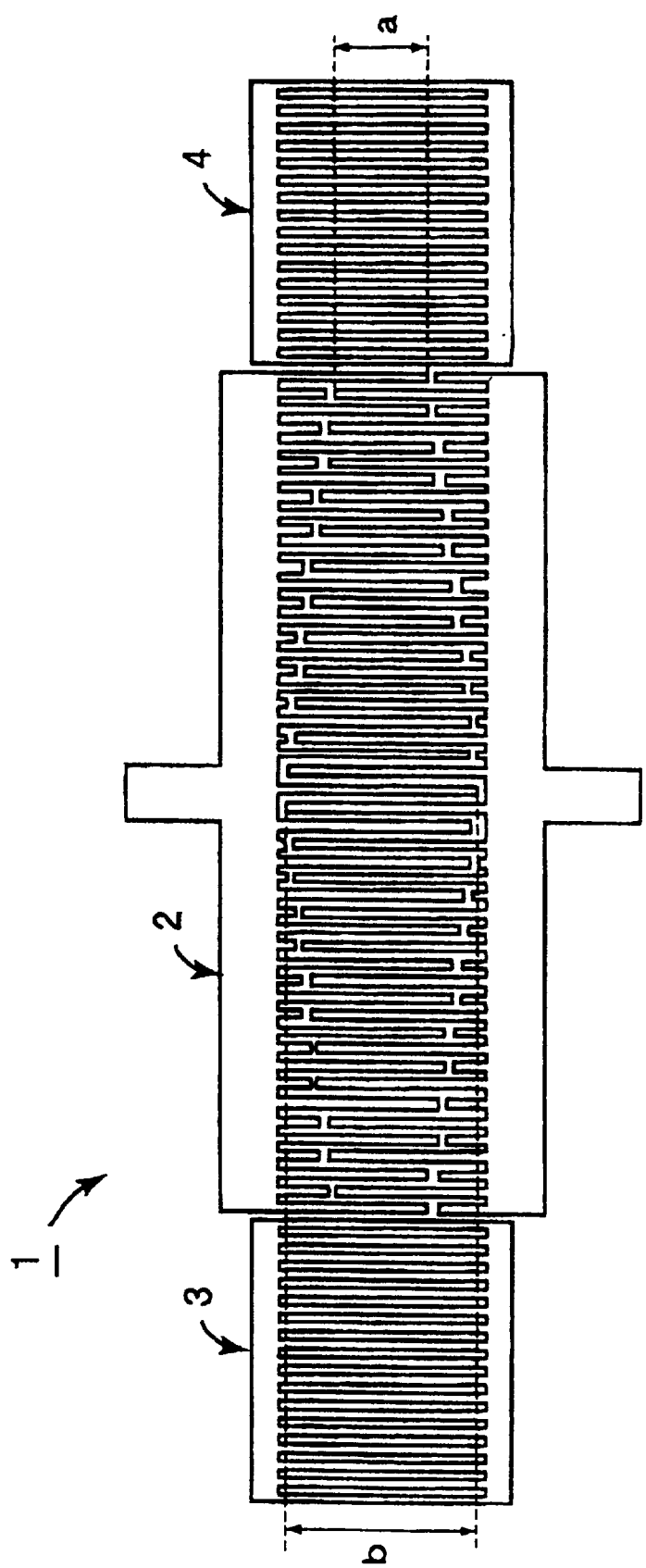
FIG. 3 is a plan view showing the electrode structure of yet another preferred embodiment of an apodized one-port surface acoustic wave resonator used in a surface acoustic wave filter according to the present invention.
Figure 4:
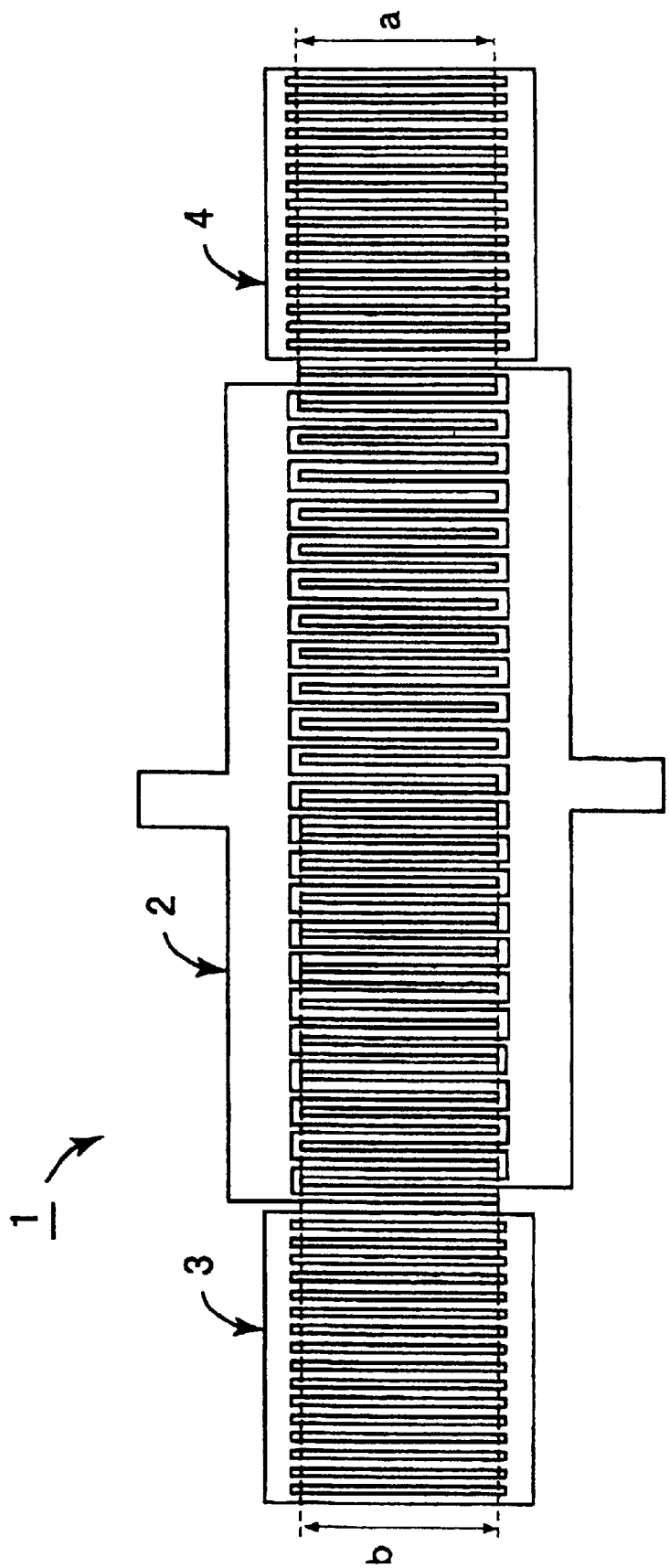
FIG. 4 is a plan view showing the electrode structure of a preferred embodiment of a normal one-port surface acoustic wave resonator used in a surface acoustic wave filter according to the present invention.

FIG. 2 to FIG. 4 schematically show electrode structures of one-port surface acoustic wave resonators when the ratio x is 0, 0.5, and 1, respectively.

Figure 5:
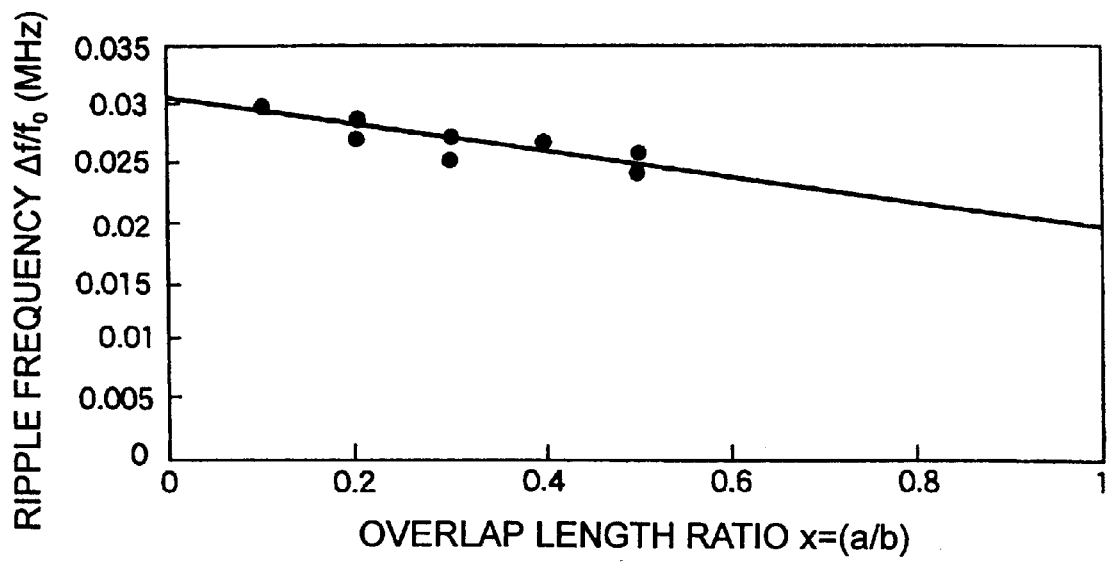
FIG. 5 is a graph showing the relationship between the overlap length ratio x in a surface acoustic wave resonator constructed in accordance with the present invention and frequencies at which ripples appear.
Figure 6:
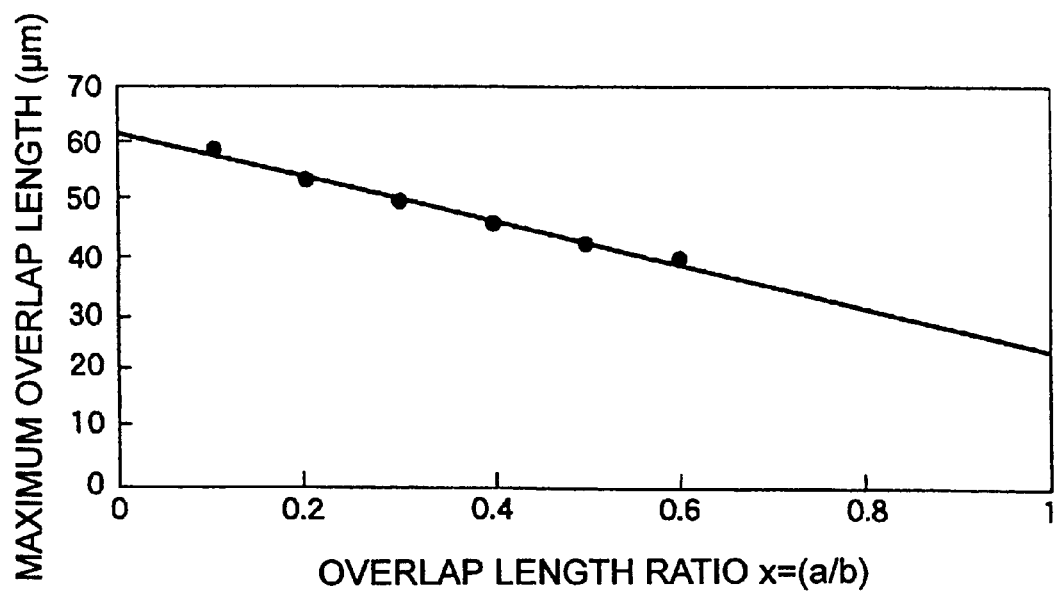
FIG. 6 is a graph showing the relationship between the overlap length ratio x in a surface acoustic wave resonator constructed in accordance with the present invention and the overlap length.

FIG. 5 shows the variation of frequency at which the ripples appear when the ratio x is varied. The vertical axis in FIG. 5, frequency $\Delta f/f_0$ ($f_0$ is the center frequency), shows the variation of the ripple frequency $f_2$ from the anti-resonant frequency $f_1$ of the surface acoustic wave resonator 1, i.e., $\Delta f=|f_2-f_1|$. To maintain the capacitance of the IDT constant even if the ratio x in FIG. 5 is varied, the maximum overlap length b when the ratio x in FIG. 5 is varied is set as shown in FIG. 6.

The piezoelectric substrate used was a 42° Y-X LiTaO$_3$ substrate and the film thickness of the IDT (a value standardized in accordance with the wavelength x of the surface waves) was h/λ=9.6%.

As is apparent from FIG. 5, by changing the ratio x, the frequency position of the ripples is shifted. More specifically, as the ratio x becomes smaller, $\Delta f$ becomes larger, and the ripples are shifted to the higher frequency side.

On the other hand, a surface acoustic wave filter having a ladder-type circuit configuration yields desired filter characteristics by combining a plurality of one-port surface acoustic wave resonators. Therefore, by varying the ratio x among the one-port surface acoustic wave resonators, the ripple positions are varied, thereby increasing the minimum value of insertion loss within the pass band, i.e., peak loss. As a result, evenness of insertion loss within the pass band is improved, i.e., the variation of insertion loss within the pass band is greatly reduced.

Generally, higher-mode waves tend to appear on the higher-frequency side that is higher the fundamental-mode oscillation frequency. However, it is known that, in a resonator including a rotation Y-plate LiTaO$_3$ substrate and using SH-type surface waves, the higher-mode appears on the lower-frequency side that is lower the fundamental-mode oscillation frequency, and by increasing the overlap length in the IDT, the higher-mode frequency increases. (Proceedings of the Acoustic Society of Japan, June, Showa 54, p.77, 3-1-1)

However, the inventors of the present application discovered that, as the overlap length of the electrode fingers of the IDT increases, the frequency gap $\Delta f$ corresponding to the ripple positions also increases, i.e., the frequency position of spurious response decreases. Therefore, it was determined that the spurious response is not caused by the higher-mode but is caused by SSBW.

The frequency of the ripples caused by SSBW at issue is controlled, as described above, by varying the value of the overlap length ratio x. Because the shape of the IDT is altered as the overlap length ratio x is varied, the ripple frequency position is controlled in accordance with the shape of weighting.

Preferred embodiments of the present invention, as described above, takes advantage of the variation, in accordance with weighting by the apodization method, of the frequency position of ripples which appear within the pass band of a surface acoustic wave resonator. More specifically, a surface acoustic wave filter having a ladder-type circuit configuration is characterized in that at least two series arm resonators are apodized, and apodization for at least one series arm resonator is different from apodization for the other series arm resonators, such that the positions at which ripples appear are varied to reduce the variation of loss within the pass band.

The present invention will become apparent through the description of various preferred embodiments of the present invention hereinbelow.

Figure 7A:
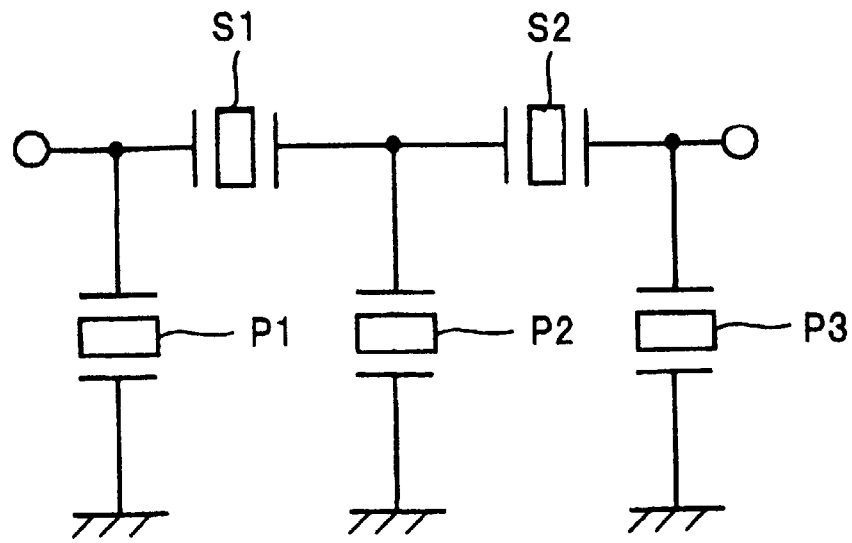
FIG. 7A is a diagram showing the circuit configuration of a surface acoustic wave filter according to a preferred embodiment of the present invention and FIG. 7B is a schematic plan view of the surface acoustic wave filter.
Figure 7B:
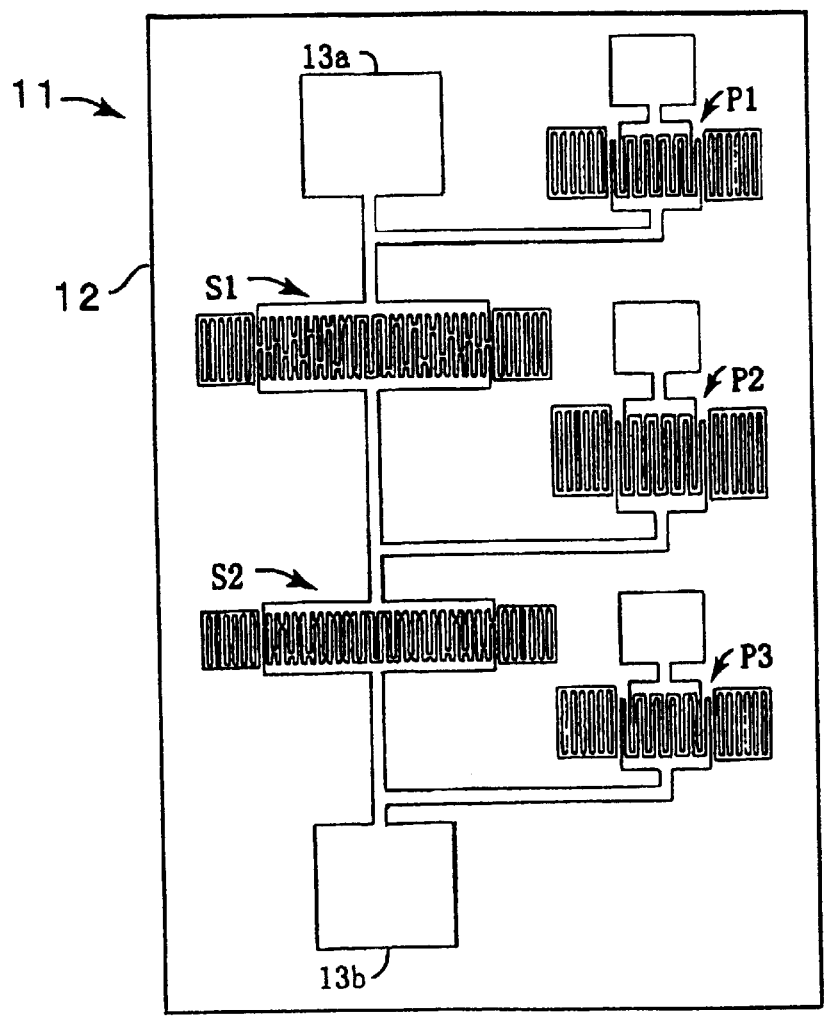

FIG. 7A is a diagram showing the circuit configuration of a surface acoustic wave filter according to a preferred embodiment of the present invention and FIG. 7B is a schematic plan view thereof.

A surface acoustic wave filter 11 in this particular preferred embodiment includes a substantially rectangular-plate piezoelectric substrate 12. The piezoelectric substrate 12 is preferably made of a 42° Y-cut-X propagation LiTaO$_3$ substrate. As the piezoelectric substrate 12, a piezoelectric substrate other than the 42° Y-cut-X propagation LiTaO$_3$ substrate may be used.

In this preferred embodiment, on the piezoelectric substrate 12, there are provided two series arm resonators S1 and S2, and three parallel arm resonators P1 to P3. Each of the resonators S1, S2, and P1 to P3 preferably includes a single-pair surface acoustic wave resonator as shown in FIG. 1.

Referring to FIG. 7B, an electrode pad 13a is connected to the series arm resonator S1 and the parallel arm resonator P1. via wiring electrodes. One end of the series arm resonator S1, opposite to the side connected to the electrode pad 13a, is connected to the series arm resonator S2 and the parallel arm resonator P2 via wiring electrodes. Furthermore, one end of the series arm resonator S2, opposite to the side connected to the series arm resonator S1, is connected to an electrode pad 13b and the parallel arm resonator P3. Between the electrode pads 13a and 13b, the series arm resonators S1 and S2 are connected in series. The ends of the parallel arm resonators P1 to P3, opposite to the side connected to the series arm resonators, are connected to the ground potential.

The resonators S1, S2, and P1 to P3, the electrode pads 13a and 13b, and the wiring electrodes, disposed on the piezoelectric substrate 12, are preferably formed of Al.

However, these electrodes may be formed of metals other than Al, for example, Al-containing alloy, copper, Ti, and multilayered structures thereof.

This preferred embodiment is characterized in that the IDTs of the two series arm resonators S1 and S2 are weighted by the apodization method as shown in FIG. 1 to FIG. 3, and in that the above-described overlap length ratio x of the series arm resonator S1 is different from the overlap length ratio x of the series arm resonator S2.

In this preferred embodiment, the overlap length ratio x of the series arm resonator S1 is about 0.1, while the overlap length ratio x of the series arm resonator S2 is about 0.6.

Other specifications of each of the resonators are as follows.

With regard to the series arm resonator S1, the maximum overlap length of the electrode fingers is about 58 $\mu$m, the number of pairs of the electrode fingers is 113, and the number of the electrode fingers of the reflectors is 30. With regard to the series arm resonator S2, the maximum overlap length of the electrode fingers of the IDT is about 40 $\mu$m, the number of pairs of the electrode fingers is 113, and the number of the electrode fingers of the reflectors is 20.

The overlap lengths are varied between the series arm resonators S1 and S2 to adjust the capacitance of the IDT.

With regard to the parallel arm resonators P1 and P3, the overlap length of electrode fingers is about 78 $\mu$m, the number of pairs of the electrode fingers is 50, and the number of the electrode fingers of the reflectors is 20. With regard to the parallel arm resonator P2, the overlap length of the electrode fingers of the IDT is about 113 $\mu$m, the number of pairs of the electrode fingers is 120, and the number of the electrode fingers of the reflectors is 20.

Figure 8:
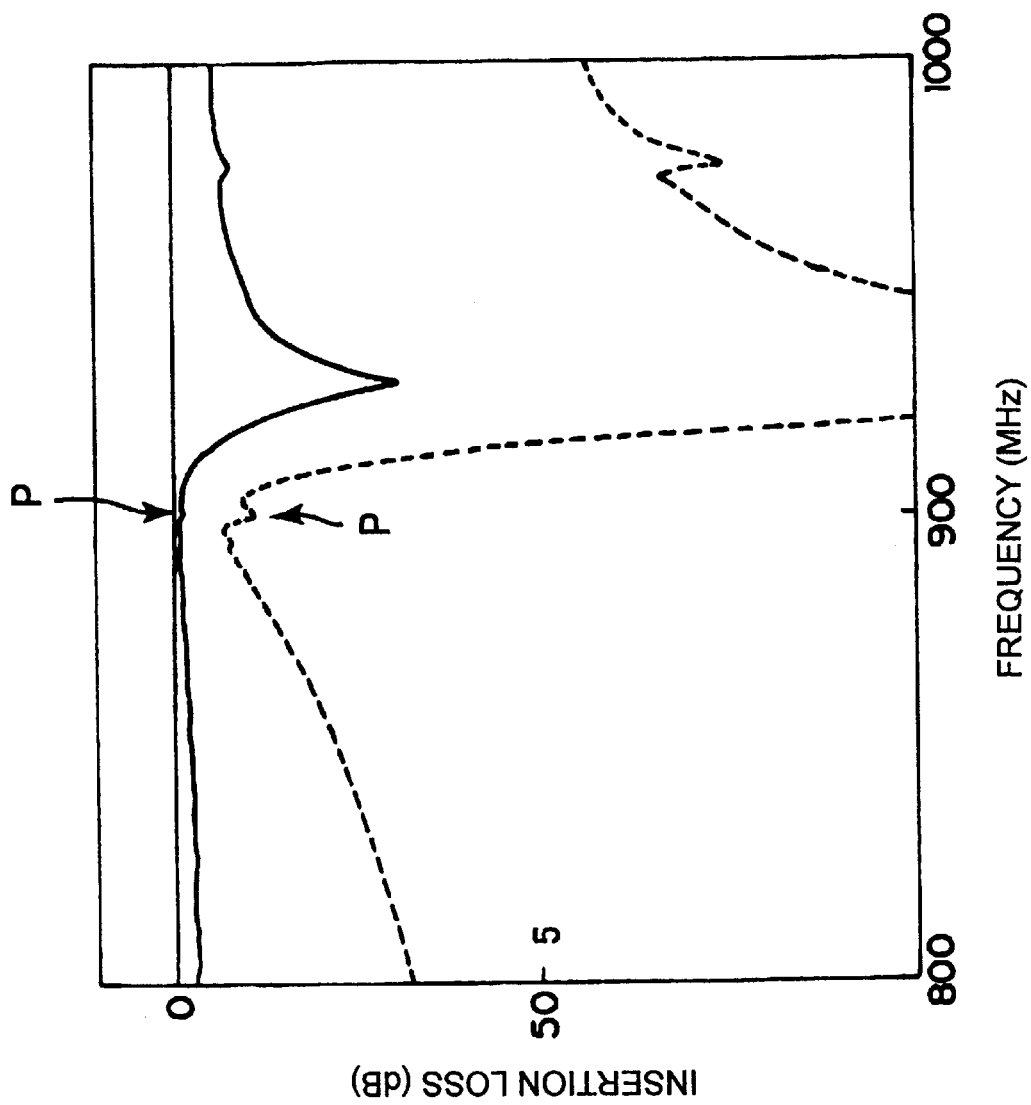
FIG. 8 is a graph showing the transmission characteristics of the series arm resonator S1 of the surface acoustic wave filter according to the preferred embodiment shown in FIG. 7.
Figure 9:
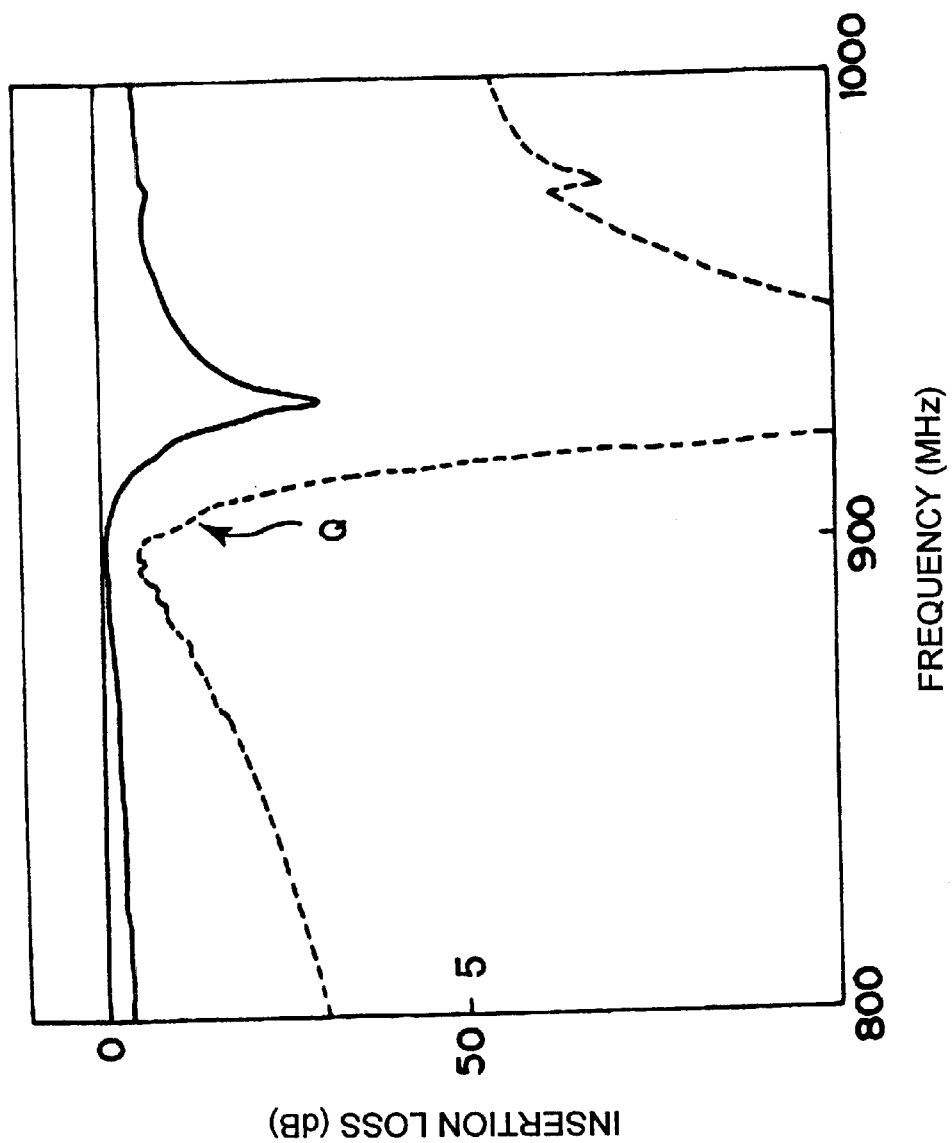
FIG. 9 is a graph showing the transmission characteristics of a series arm resonator S2 used in the preferred embodiment shown in FIG. 7.

FIG. 8 shows the transmission characteristics of the series arm resonator S1 and FIG. 9 shows the transmission characteristics of the series arm resonator S2. Indicated by the dashed lines below in FIG. 8 and FIG. 9 are insertion loss characteristics expanded to the scale shown to the right of the vertical axis.

As shown in FIG. 8, with regard to the transmission characteristics of the series arm resonator S1, ripples appear at the position indicated by the arrow P, and as is apparent from FIG. 9, with regard to the transmission characteristics of the series arm resonator S2, ripples appear at the position indicated by the arrow Q. The position indicated by the arrow P is around 900 MHz, while the frequency position indicated by the arrow Q is around 910 MHz. Thus, the ripple frequency positions differ between the series arm resonators S1 and S2.

Figure 10:
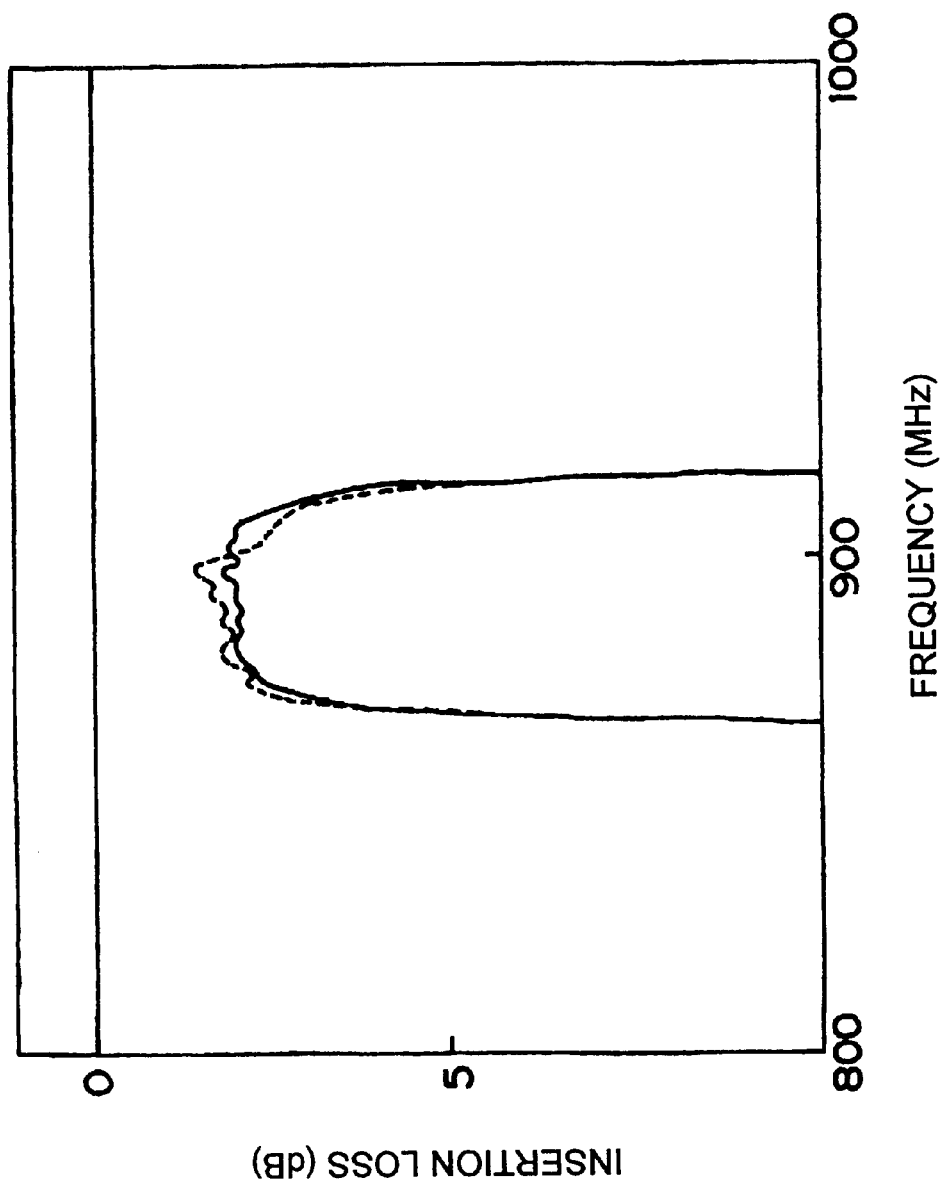
FIG. 10 is a graph showing the filter characteristics of the preferred embodiment shown in FIG. 7 and characteristics of a comparative surface acoustic wave filter.

FIG. 10 shows, by the solid line, filter characteristics of the surface acoustic wave filter of this preferred embodiment. The dashed line shows the filter characteristics of a comparative surface acoustic wave filter. The comparative filter is a surface acoustic wave filter constructed identically to that of the preferred embodiment except that the overlap length ratios x of the series arm resonators S1 and S2 are set to be the same value, i.e., x=0.6.

As is apparent from FIG. 10, the surface acoustic wave filter of the preferred embodiment in which the series arm resonators are apodized by different amounts, the ripple frequency positions are varied to significantly improve evenness of insertion loss within the pass band. Furthermore, loss characteristics in the high-frequency side within the pass band are greatly improved, and in addition, 3-dB bandwidth is increased by approximately 10%. Furthermore, the sharpness of the filter characteristics in the high-frequency side of the pass band is also greatly enhanced.

In the above-described preferred embodiment of the present invention, a surface acoustic wave filter having two series arm resonators and three parallel arm resonators is described. However, in a surface acoustic wave filter according to preferred embodiments of the present invention, the number of the series arm resonators may be any number not less than two, and there is no limitation regarding the number of the parallel arm resonators.

Furthermore, in various preferred embodiments of the present invention, as long as at least one of the plurality of series arm resonators is apodized differently from the other series arm resonators, the frequency positions of the ripples which appear within the pass band are varied, imposing no particular limitation regarding the difference of apodization. That is, as long as the frequency positions of the ripples, generated within the pass band by the plurality of series arm resonators, are varied, there is no particular limitation regarding the difference of apodization.

Furthermore, as is apparent from the above preferred embodiment, as long as the ratio of the maximum value and the minimum value of overlap length is different between at least one apodized series arm resonator and the other apodized resonator such that the frequency positions of ripples caused by the plurality of series arm resonators are different from one another, there is no particular limitation regarding the difference of overlap length ratio.

Next, a preferred embodiment of an antenna duplexer incorporating a surface acoustic wave filter according to the present invention will be described with reference to FIG. 11.

Figure 11:
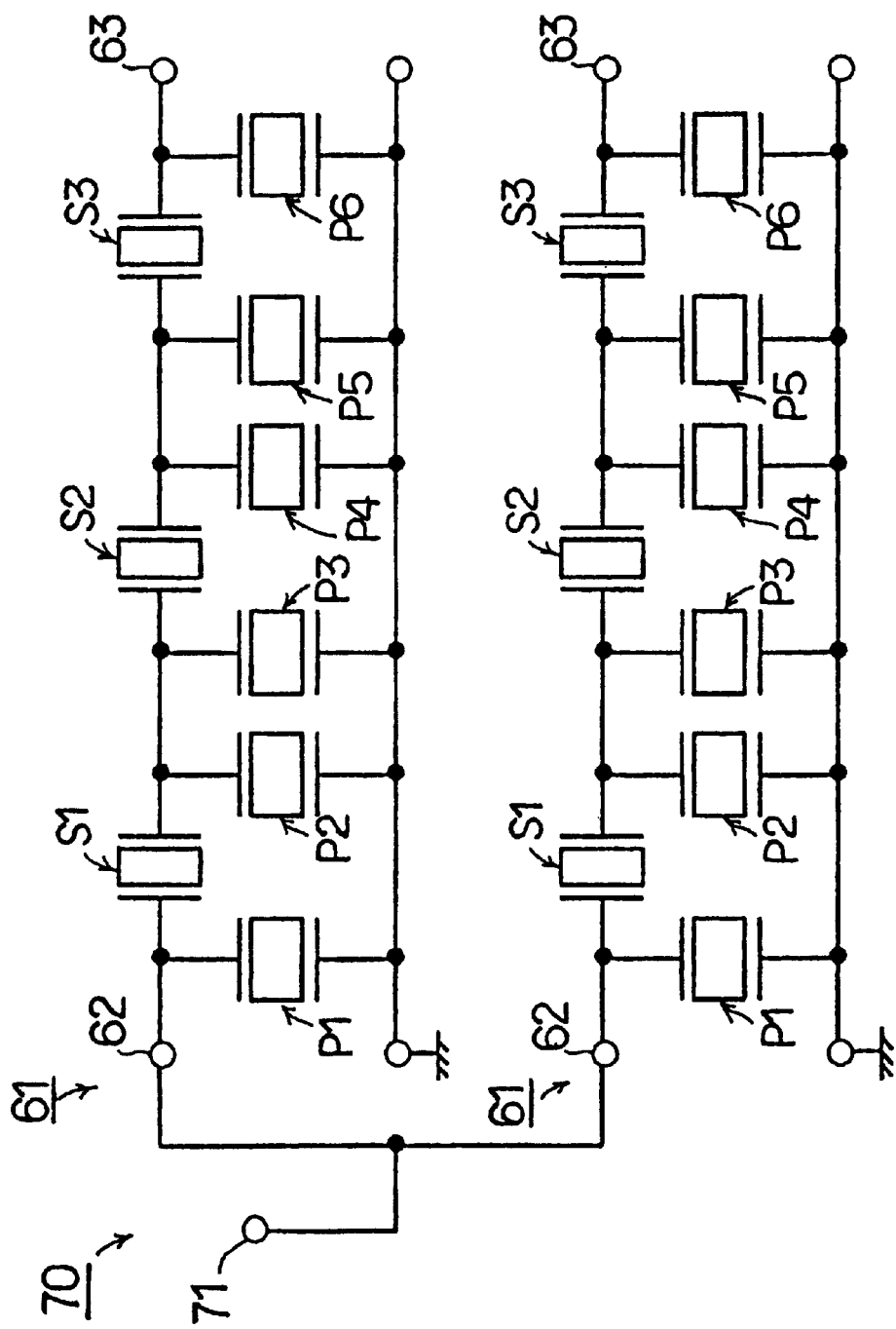
FIG. 11 is a circuit diagram showing an example of an antenna duplexer according to a preferred embodiment of the present invention.

FIG. 11 is a circuit diagram illustrating an antenna duplexer according to a preferred embodiment of the present invention. The antenna duplexer 70 includes a pair of ladder-type filters 61 which are substantially the same, except in the number of stages, as the ladder-type surface acoustic wave filter shown in FIG. 7. More specifically, the input terminals 62 and 62 of the ladder-type filters 61 are commonly connected to define a first port 71. On the other hand, the output terminals 63 and 63 of the ladder-type filters 61 and 61 are utilized independently, respectively defining a second port and a third port of the antenna duplexer of this preferred embodiment. Between each of the ladder-type filters 61 and the input terminal 62, an impedance matching element such as a coil, a capacitor, and a microstrip line may be interposed.

Accordingly, an antenna duplexer is provided having a pair of ladder-type filters 61.

Figure 12:
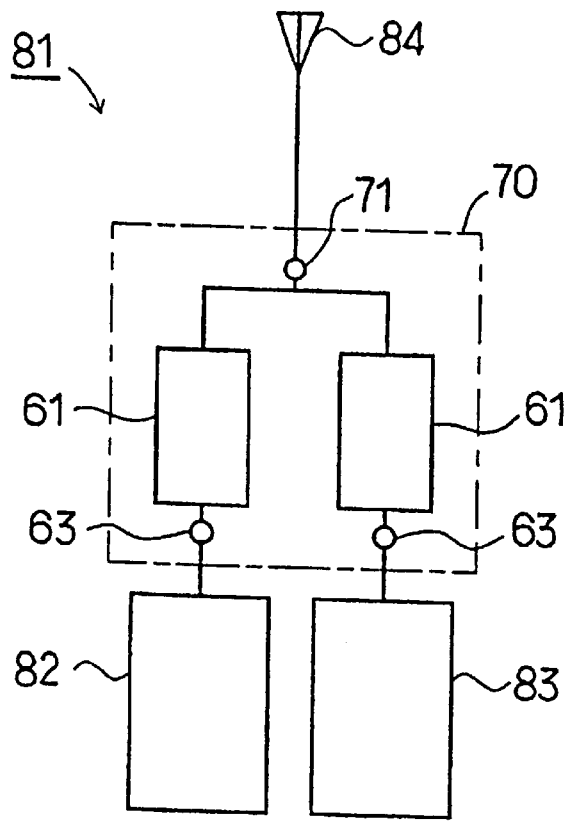
FIG. 12 is a schematic block diagram illustrating an example of a communications device according to a preferred embodiment of the present invention.

Furthermore, the above antenna duplexer may be incorporated in a communications device, an example of which is shown in FIG. 12.

The communications device 81 according to this preferred embodiment includes the antenna duplexer 70, and transmitting or receiving circuits 82 and 83. The first port 71 of the antenna duplexer 70 is connected to an antenna 84, and the output terminals 63 defining the second port and the third port are connected, respectively, to the transmitting or receiving circuits 82 and 83.

In the antenna duplexer 70, the pair of ladder-type filters 61 and 61 have different pass bands. As a result, the antenna 84 may be used as a transmitting antenna and a receiving antenna.

Figure 13:
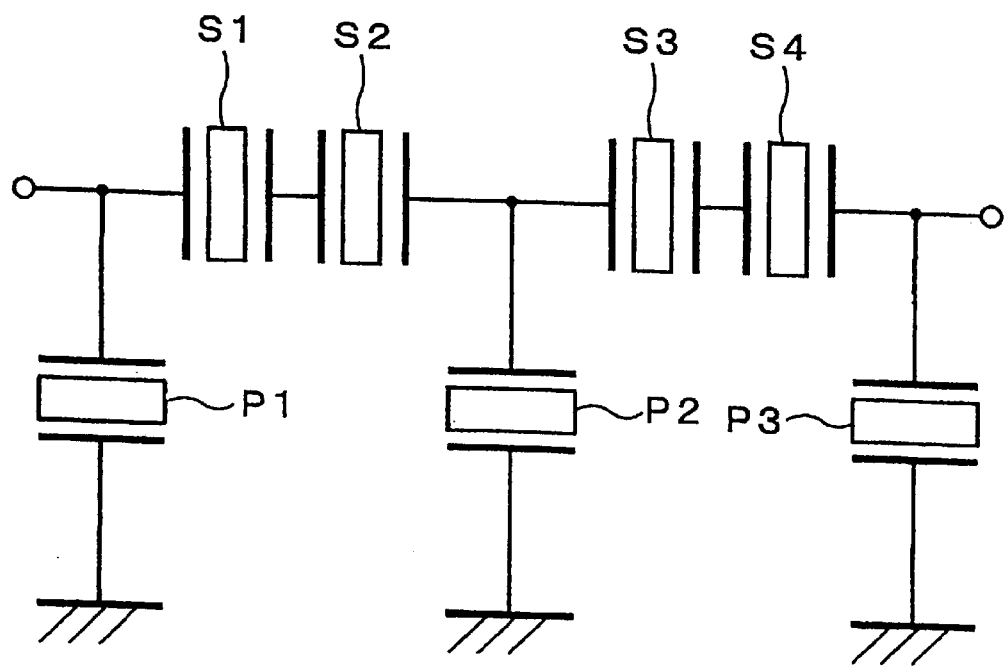
FIG. 13 is a diagram showing the circuit configuration of a surface acoustic wave filter according to another preferred embodiment of the present invention.
Figure 14:
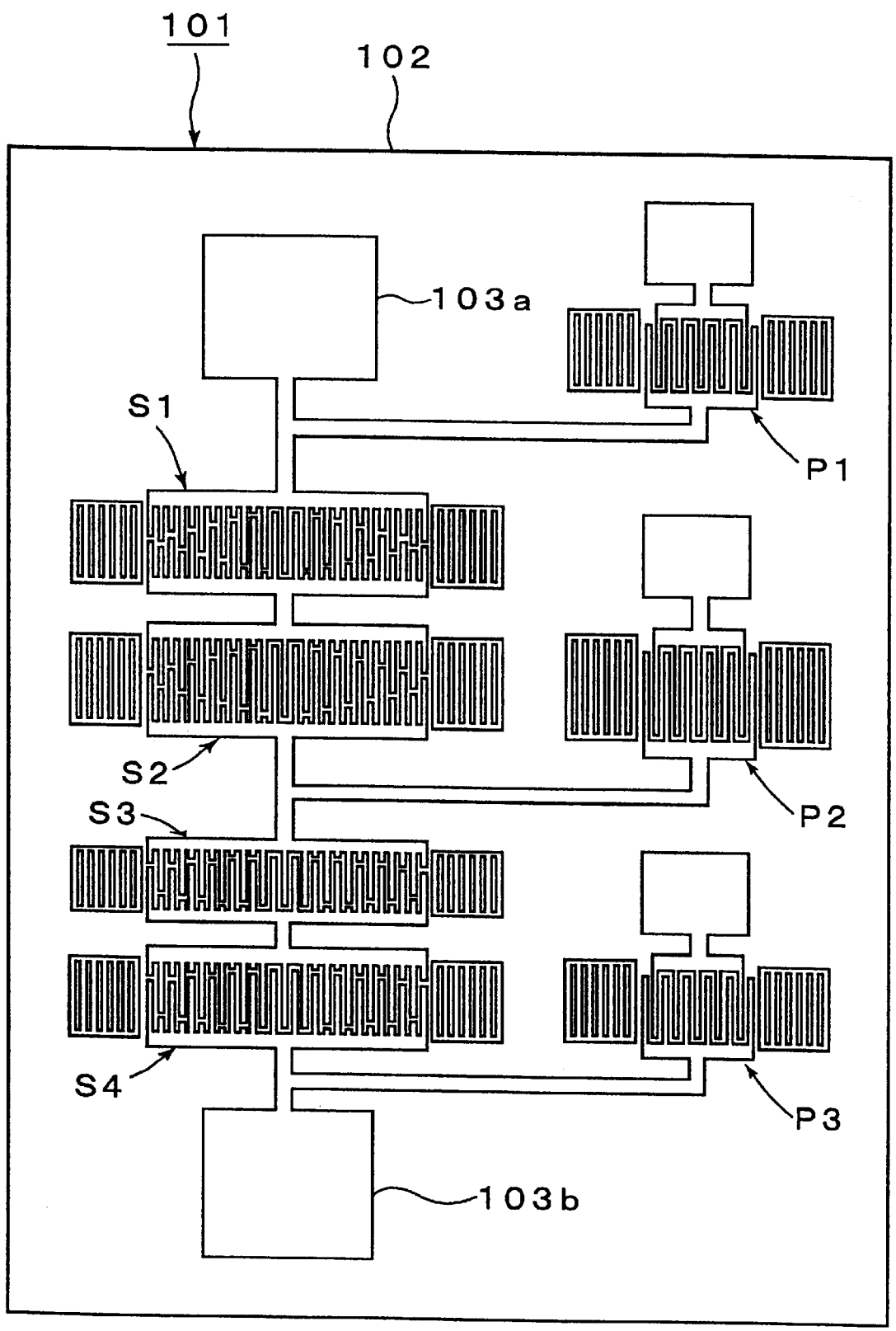
FIG. 14 is a schematic plan view of the surface acoustic wave filter shown in FIG. 13.

FIG. 13 is a circuit diagram showing the circuit configuration of a surface acoustic wave filter according to another preferred embodiment of the present invention, and FIG. 14 is a schematic plan view thereof. The surface acoustic wave filter 101 of this preferred embodiment is a ladder-type filter in the 2-GHz band.

The surface acoustic wave filter 101 includes a substantially rectangular-plate piezoelectric substrate 102. The piezoelectric substrate 102 is preferably made of the same material as the piezoelectric substrate 12 in the first preferred embodiment.

In this preferred embodiment, on the piezoelectric substrate 102, four series arm resonators S1 to S4 and three parallel arm resonators P1 to P3 are provided. Each of the resonators S1 to S4 and P1 to P3 is defined by a one-port surface acoustic wave resonator as shown in FIG. 1. Referring now to FIG. 14, an electrode pad 103a is connected to the series arm resonator S1 and the parallel arm resonator P1 via wiring electrodes. One end of the series arm resonator S1, opposite to the side connected to the electrode pad 103a, is connected to the series arm resonator S2 via a wiring electrode. One end of the series arm resonator S2, opposite to the side connected to the series arm resonator S1, is connected to the series arm resonator S3 and the parallel arm resonator P2 via wiring electrodes. Furthermore, one end of the series arm resonator S3, opposite to the side connected to the series arm resonator S2, is connected to the series arm resonator S4 via a wiring electrode. One end of the series arm resonator S4, opposite to the side connected to the series arm resonator S3, is connected to an electrode pad 103b and the parallel arm resonator P3 via wiring electrodes.

A series arm is defined between the electrode pads 103a and 103b, the series arm resonators S1 to S4 of the series arm being connected in series with one another. The ends of the parallel arm resonators P1 to P3, opposite to the side connected to the series arm, are connected to the ground potential.

The resonators S1 to S4, and P1 to P3, the electrode pads 103a and 103b, and the wiring electrodes provided on the piezoelectric substrate 102 are preferably made of Al. However, these electrodes may be made of Al-containing alloy, other metals such as copper, Ti, or alloys thereof, and may be formed by laminating a plurality of metallic sheets.

This preferred embodiment is arranged such that the IDTs of thee four series arm resonators S1 to S4 are weighted by the apodization method as shown in FIG. 1 to FIG. 3, and in that the overlap length ratios $xs_1$, $xs_2$, $xs_3$, and $xs_4$ are approximately 0.3, 0.4, 0.6, and 0.7, respectively.

Taking the series arm resonator S1 as an example, the series arm resonator S1 is weighted by the apodization method, and, with regard to the maximum value a and the minimum value b of the overlap length in the IDT of the series arm resonator S1, the overlap length ratio $xs_1$ is a/b, and the overlap length ratio is set to be $xs_1$=0.3.

Specifications of the resonators S1 to S4 and P1 to P4 are as follows.

With regard to the series arm resonator S1, the maximum overlap length of the electrode fingers of the IDT is about 61.5 μm, the number of pairs of the electrode fingers is 106, and the number of the electrode fingers of the reflectors is 28. With regard to the series arm resonator S2, the maximum overlap length of the electrode fingers of the IDT is about 57.1 μm, the number of pairs of the electrode fingers is 106, and the number of the electrode fingers of the reflectors is 28. With regard to the series arm resonator S3, the maximum overlap length of the electrode fingers of the IDT is about 51.2 μm, the number of pairs of the electrode fingers is 103, and the number of the electrode fingers of the reflectors is 28. With regard to the series arm resonator S4, the maximum overlap length of the electrode fingers of the IDT is about 48.2 μm, the number of pairs of the electrode fingers is 103, and the number of the electrode fingers of the reflectors is 28.

The overlap lengths are varied, as above, among the series arm resonators S1, S2, S3, and S4 to adjust the capacitance of the IDT.

With regard to the parallel arm resonators P1 and P3, the overlap length of electrode fingers is about 39 μm, the number of pairs of the electrode fingers is 42, and the number of the electrode fingers of the reflectors is 40. With regard to the parallel arm resonator P2, the overlap length of the electrode fingers of the IDT is about 59 μm, the number of pairs of the electrode fingers is 109, and the number of the electrode fingers of the reflectors is 50.

Figure 15:
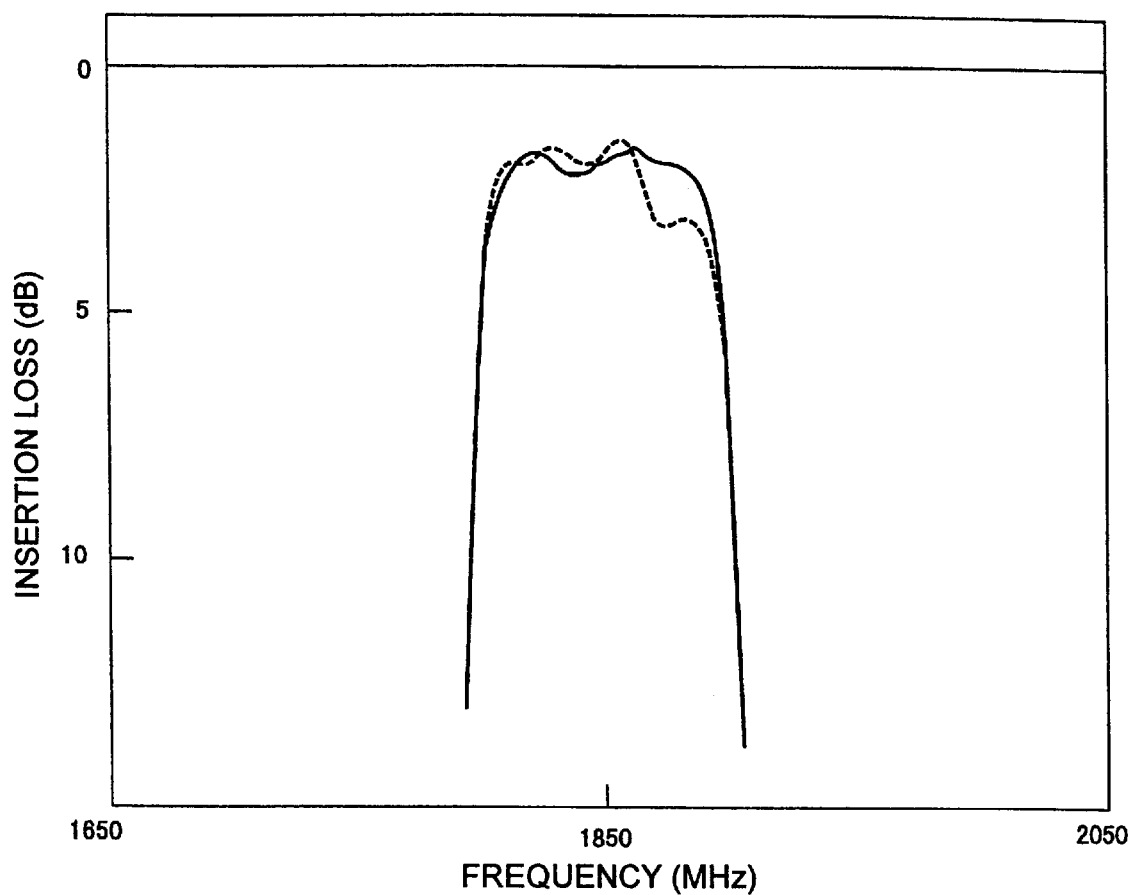
FIG. 15 is a graph showing the filter characteristics of the surface acoustic wave filter of the preferred embodiment shown in FIG. 13 and FIG. 14, and the filter characteristics of a comparative surface acoustic wave filter.
Figure 16:
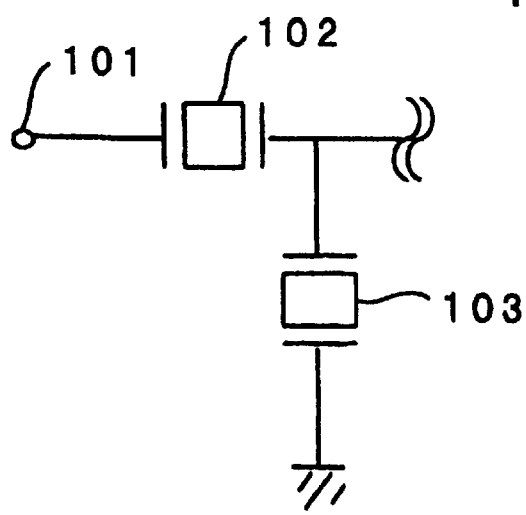
FIG. 16 is a diagram showing the basic circuit configuration of a surface acoustic wave filter having the conventional ladder-type circuit configuration.
Figure 17:
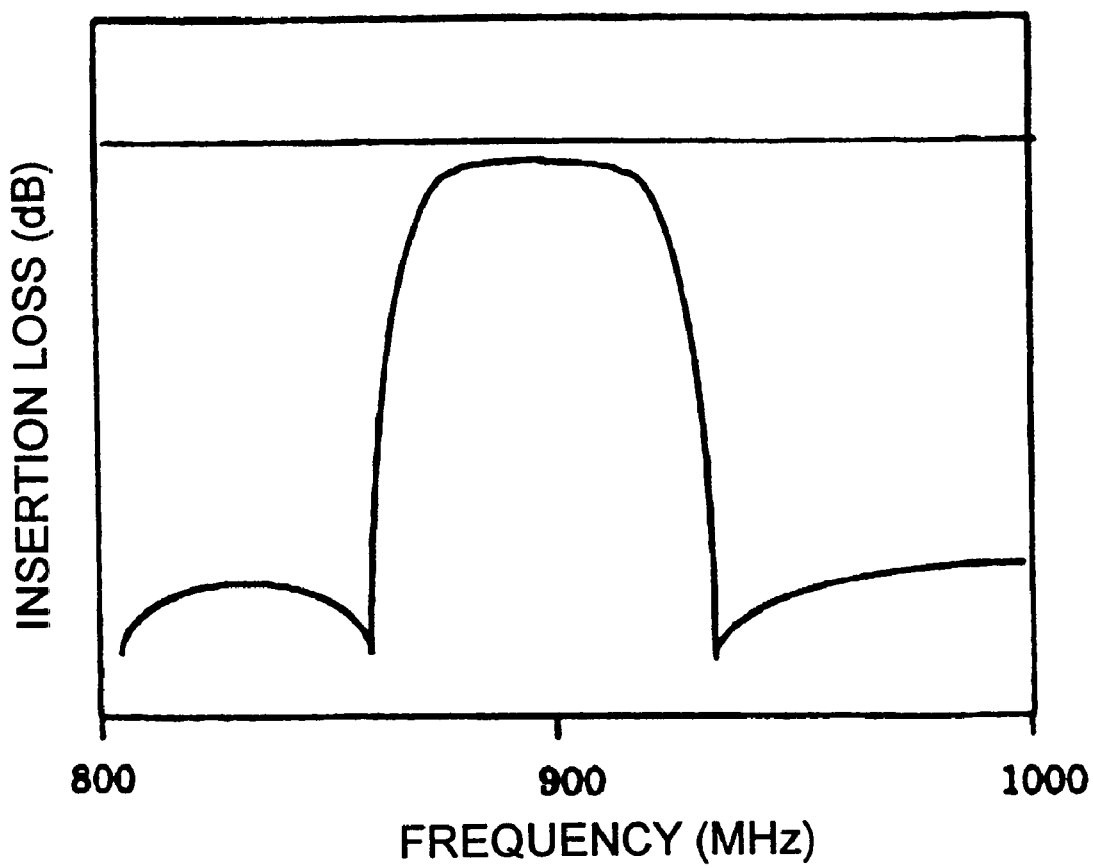
FIG. 17 is a graph showing an example of filter characteristics of the conventional surface acoustic wave filter.

FIG. 15 shows, by the solid line, filter characteristics of the surface acoustic wave filter of this preferred embodiment. The dashed line shows the filter characteristics of a comparative surface acoustic wave filter. The comparative filter is a surface acoustic wave filter constructed substantially identical to the preferred embodiment described above except that the overlap length ratios x of the series arm resonators S1, S2, S3, and S4 are set to be the same value, i.e., x=0.7.

As shown in FIG. 14, the surface acoustic wave filter of the preferred embodiment in which the series arm resonators are differently apodized, the ripple frequency positions are varied so as to enhance evenness of insertion loss within the pass band. Furthermore, loss characteristics in the high-frequency side within the pass band are greatly improved, and the sharpness of the filter characteristics in the high-frequency side of the pass band is also greatly enhanced.

As is apparent from the preferred embodiment described with reference to FIG. 13 and FIG. 14, in a surface acoustic wave filter according to the present invention, with respect to any two series arm resonators $S_i$ and $S_j$ among a plurality of series arm resonators S1 to S4, and their respective overlap length ratios $x_i$ and $x_j$, there exists series arm resonators $S_i$ and $S_j$, in which the absolute value $\Delta_{ij}$ of the difference between the overlap length ratio $x_i$ and the overlap length ratio $x_j$ is a value other than 0, so that variation within the pass band is further reduced. More specifically, with regard to the filter characteristics indicated by the dashed line in FIG. 15, the absolute value $\Delta_{ij}$ of the difference between the overlap length ratios is 0, thus not reducing variation of loss within the pass band. On the other hand, in the preferred embodiment shown in FIG. 13 and FIG. 14, there exist series arm resonators $S_i$ and $S_j$ in which $\Delta_{ij}$ is a value other than 0, so that evenness of the frequency characteristics within the pass band is greatly enhanced.

Particularly, as shown by the solid line in FIG. 15, in this preferred embodiment, a series arm resonator pair in which $\Delta_{ij}$ is at least 0.1 is provided, for example, the series arm resonator $S_i$ and the series arm resonator S2, the series arm resonator S2 and the series arm resonator S3, and the series arm resonator S3 and the series arm resonator S4, greatly enhancing evenness within the pass band.

As is apparent from FIG. 8, the difference of frequencies between the minimum point and the maximum point of the ripples to the left of the minimum point indicated by the arrow P is 2.47 MHz, and is approximately 3.3 MHz for the maximum point to the right thereof. Thus, by shifting the frequency of the ripples P by approximately 2.47 MHz, the minimum point and the maximum point are overlapped, canceling the two ripples.

On the other hand, as is apparent from FIG. 5, when the overlap length ratio x on the horizontal axis of FIG. 5 is varied by about 0.1, the shift of $\Delta f/f_0$ on the vertical axis is approximately 0.00125. Therefore, when considered in terms of frequency, the shift of the ripple frequency is $0.00125 \times f_0 = 0.00125 \times 942.5 = 1.18$ (MHz). That is, in order to shift the ripple frequency by approximately 2.47 MHz, the overlap length should be varied by $2.47/1.18=2.09$. In other words, by setting the absolute value $\Delta_{ij}$ of the difference between the overlap length ratios to about 0.2, the minimum point and the maximum point of the ripples are overlapped. Thus, by an arrangement in which there exist two series arm resonators $S_i$ and $S_j$ in which the absolute value $\Delta_{ij}$ of the overlap length ratios is about 0.2 or greater, evenness of the frequency characteristics within the pass band is further enhanced.

It is to be noted that overlapping the minimum point and the maximum point of the ripples does not necessarily contribute to enhancement of evenness of the frequency characteristics within the pass band. Thus, with this taken into consideration, by arranging any two series arm resonators $S_i$ and $S_j$ in which the absolute value $\Delta_{ij}$ of the difference between the overlap length ratios is at least about 0.1, evenness of the frequency characteristics within the pass band is greatly enhanced in accordance with preferred embodiments of the present invention.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
   a piezoelectric substrate;
   at least two series arm resonators and at least one parallel arm resonator each defined by one-port surface acoustic wave resonators and disposed on said piezoelectric substrate, said at least two series arm resonators and at least one parallel arm resonator being connected to define a ladder-type circuit;
   wherein each of said at least two series arm resonators includes an interdigital transducer weighted by apodization, and the apodizations for said at least two series arm resonators are different from each other; and
   a ratio between a maximum value and a minimum value of overlapping length in the apodization is different between said at least two series arm resonators.

2. A surface acoustic wave filter according to claim 1, wherein at least about 80% of electrode fingers of said interdigital transducers of said at least two series arm resonators are apodized.

3. A surface acoustic wave filter according to claim 1, wherein said at least two series arm resonators and said at least one parallel arm resonator are made of Al.

4. A surface acoustic wave filter according to claim 1, wherein frequency positions of ripples caused by said at least two series arm resonators are different from one another.

5. A surface acoustic wave filter according to claim 1, wherein the difference between the two ratios is at least about 0.1.

6. A surface acoustic wave filter according to claim 1, wherein the difference between the two ratios is at least about 0.2.

7. A surface acoustic wave filter according to claim 1, wherein said surface acoustic wave filter comprises more than two series arm resonators, and at least about 80% of electrode fingers of said interdigital transducers of said more than two series arm resonators are apodized.

8. A surface acoustic wave filter according to claim 7, wherein a ratio between the maximum value and the minimum value of overlapping length in the apodization is different between any pair selected from said more than two series arm resonators.

9. A surface acoustic wave filter according to claim 8, wherein frequency positions of ripples caused by said more than two series arm resonators are different from one another.

10. A surface acoustic wave filter according to claim 8, wherein the difference between the two ratios is at least about 0.1.

11. A surface acoustic wave filter according to claim 8, wherein the difference between the two ratios is at least about 0.2.

12. A surface acoustic wave filter according to claim 1, wherein said piezoelectric substrate is a 42° Y-X LiTaO$_3$ substrate.

13. A surface acoustic wave filter according to claim 1, wherein said at least two series arm resonators includes two series arm resonators, and said at least one parallel arm resonator includes three parallel arm resonators.

14. An antenna duplexer comprising a surface acoustic wave filter according to claim 1.

15. A communications device comprising an antenna duplexer according to claim 14.

* * * * *